United States Patent
Furuki et al.

(10) Patent No.: US 10,132,974 B2
(45) Date of Patent: Nov. 20, 2018

(54) CIRCULARLY POLARIZING PLATE AND DISPLAY DEVICE

(71) Applicant: FUJIFILM Corporation, Tokyo (JP)

(72) Inventors: Yusuke Furuki, Kanagawa (JP); Naoyoshi Yamada, Kanagawa (JP); Masakane Muto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 97 days.

(21) Appl. No.: 15/465,914

(22) Filed: Mar. 22, 2017

(65) Prior Publication Data

US 2017/0192145 A1 Jul. 6, 2017

Related U.S. Application Data

(63) Continuation of application No. PCT/JP2015/077199, filed on Sep. 25, 2015.

(30) Foreign Application Priority Data

Sep. 30, 2014 (JP) ................. 2014-200993

(51) Int. Cl.
  *G02B 5/30* (2006.01)
  *B32B 7/02* (2006.01)
  (Continued)

(52) U.S. Cl.
  CPC .............. *G02B 5/3016* (2013.01); *B32B 7/02* (2013.01); *G02B 5/30* (2013.01); *G02B 5/3041* (2013.01);
  (Continued)

(58) Field of Classification Search
  None
  See application file for complete search history.

(56) References Cited

U.S. PATENT DOCUMENTS 9,588,271 B2  3/2017  Yamada et al.
2007/0296892 A1* 12/2007 Kashima ............... G02F 1/1323
                                                  349/98

(Continued)

FOREIGN PATENT DOCUMENTS

WO  2013/137464 A1  9/2013

OTHER PUBLICATIONS

International Preliminary Report on Patentability and Written Opinion issued by WIPO dated Apr. 13, 2017, in connection with international Patent Application No. PCT/JP2015/077199.

(Continued)

*Primary Examiner* — Paul Lee
*Assistant Examiner* — Mariam Qureshi
(74) *Attorney, Agent, or Firm* — Edwards Neils, LLC; Jean C. Edwards, Esq.

(57) ABSTRACT

The present invention provides a circularly polarizing plate that improves the visibility of black color in an oblique direction when being applied to a display device and having a small thickness, the display device including a circularly polarizing plate. The circularly polarizing plate is a circularly polarizing plate including, in this order, a polarizer, a λ/2 plate, and a λ/4 plate, in which the λ/2 plate is a laminate of a first A-plate and a first C-plate, the λ/4 plate is a laminate of a second A-plate and a second C-plate, one of the first C-plate and the second C-plate is a cellulose acylate film having a predetermined Rth, and the other of the first C-plate and the second C-plate is an optically anisotropic layer including a liquid crystal compound having a predetermined Rth or a cellulose acylate film having a predetermined Rth.

16 Claims, 2 Drawing Sheets

(51) Int. Cl.
*H01L 51/52* (2006.01)
*H05B 33/02* (2006.01)

(52) U.S. Cl.
CPC ...... *H01L 51/5281* (2013.01); *H01L 51/5293* (2013.01); *H05B 33/02* (2013.01)

(56) References Cited

U.S. PATENT DOCUMENTS

2014/0204296 A1* 7/2014 Mitsui ............... G02F 1/133504
349/33
2014/0375935 A1 12/2014 Yamada et al.

OTHER PUBLICATIONS

International Search Report issued in PCT/JP2015/077199 dated Dec. 22, 2015.
Written Opinion issued in PCT/JP2015/077199 dated Dec. 22, 2015.

* cited by examiner

CIRCULARLY POLARIZING PLATE AND DISPLAY DEVICE

CROSS-REFERENCE TO RELATED APPLICATIONS

This application is a Continuation of PCT International Application No. PCT/JP2015/077199 filed on Sep. 25, 2015, which was published under PCT Article 21(2) in Japanese, and which claims priority under 35 U.S.C. § 119(a) to Japanese Patent Application No. 2014-200993 filed on Sep. 30, 2014. The above applications are hereby expressly incorporated by reference, in their entirety, into the present application.

BACKGROUND OF THE INVENTION

1. Field of the Invention

The present invention relates to a circularly polarizing plate and a display device including a circularly polarizing plate.

2. Description of the Related Art

Conventionally, in order to suppress adverse effects caused by reflection of external light, a circularly polarizing plate has been used for an organic EL display device, an LCD display device, and the like.

For the circularly polarizing plate, an aspect in which a phase difference plate (so-called broadband λ/4 plate) including a λ/2 plate and a λ/4 plate is combined with a polarizer is suitably used and for example, a similar configuration is disclosed in WO2013/137464A.

SUMMARY OF THE INVENTION

On the other hand, in recent years, there has been a demand for further improving the visibility of a display device and specifically, when a display device is viewed in an oblique direction, there has been a demand for further improving the visibility of black color. That is, when a display device is viewed in an oblique direction, it is demanded that other color tints are not included in black color and the black color looks clearer.

In addition, from the viewpoint of thinning of a display device, a circularly polarizing plate to be used is also required to be made thin.

When the present inventors attached the circularly polarizing plate specifically disclosed in WO2013/137464A to a display device and evaluated the visibility thereof, the visibility met the level required in the related art but did not meet a level higher than recently required and further improvement was required.

The present invention is made in consideration of the above circumstances and an object thereof is to provide a circularly polarizing plate capable of achieving improvement in the visibility of black color in an oblique direction when being applied to a display device and having a small thickness.

Another object of the present invention is to provide a display device including the circularly polarizing plate.

As a result of intensive investigations of the problems in the related art, the present inventors have found that the above problems can be solved by using a cellulose acylate film having a predetermined Rth and predetermined optical properties are satisfied.

That is, it has been found that the above objects can be achieved by adopting the following configurations.

(1) A circularly polarizing plate comprising, in this order: a polarizer; a λ/2 plate; and a λ/4 plate,
in which the λ/2 plate is a laminate of a first A-plate and a first C-plate,
the λ/4 plate is a laminate of a second A-plate and a second C-plate,
one of the first C-plate and the second C-plate is a cellulose acylate film having a retardation Rth in a thickness direction at a wavelength of 550 nm of 30 to 50 nm,
the other of the first C-plate and the second C-plate is an optically anisotropic layer including a liquid crystal compound having a retardation Rth in a thickness direction at a wavelength of 550 nm of −60 to −30 nm,
in a case in which the first A-plate is a negative A-plate, Expressions (1) and (2), which will be described later, are satisfied, and
in a case in which the first A-plate is a positive A-plate, Expressions (3) and (4), which will be described later, are satisfied.

(2) The circularly polarizing plate according to (1), in which the first A-plate and the second A-plate each include a liquid crystal compound.

(3) The circularly polarizing plate according to (1) or (2), in which the liquid crystal compound in the optically anisotropic layer is a rod-like liquid crystal compound.

(4) The circularly polarizing plate according to any one of (1) to (3), in which the circularly polarizing plate has a thickness of 60 μm or less.

(5) A display device comprising: the circularly polarizing plate according to any one of (1) to (4).

According to the present invention, it is possible to provide a circularly polarizing plate capable of achieving improvement in the visibility of black color in an oblique direction when being applied to a display device and having a small thickness.

According to the present invention, it is also possible to provide a display device including the circularly polarizing plate.

DESCRIPTION OF THE PREFERRED EMBODIMENTS

Hereinafter, the contents of the present invention will be described in detail. The numerical range represented by the term "to" in the present specification include the numerical values set forth before and after "to" as lower and upper limits, respectively. First, the terms used in the present specification will be described.

Re(λ) and Rth(λ) represent the in-plane retardation at a wavelength λ and the retardation in a thickness direction, respectively. Re(λ) is measured by applying light having a wavelength of λ nm to a film in the normal direction of the film, in KOBRA 21 ADH or WR (both manufactured by Oji Scientific Instruments). The measurement wavelength λ nm can be selected by manually replacing a wavelength selective filter, or, the measured value can be converted by using a program or the like. In the case in which the film to be measured is one expressed by a uniaxial or biaxial index ellipsoid, Rth(λ) is calculated by the following method. This method is partially utilized in the measurement of the average tilt angle of the liquid crystal compound and the average tilt angle thereof on the opposite side.

Rth(λ) is measured in the following manner. Re(λ) is measured at six points in total by making light having a wavelength of λ nm incident on the film in the directions tilted from the normal direction of the film with the in-plane slow axis (which is determined with KOBRA 21ADH or WR) as the tilt axis (rotation axis) (in the case in which there is no slow axis, an arbitrary in-plane direction of the film is used as the rotation axis) to 50° on one side of the film in the normal direction with a step of 10°, and Rth(λ) is calculated with KOBRA 21ADH or WR based on the retardation values thus measured, the assumed value of the average refractive index, and the input film thickness value. In the above description, in the case in which the film has a direction where the retardation value becomes zero at a certain tilt angle from the normal direction with the in-plane slow axis as the rotation axis, the sign of the retardation value at a tilt angle larger than the aforementioned tilt angle is changed to negative and then calculated by KOBRA 21ADH or WR. With the slow axis taken as the tilt axis (rotation axis) of the film (in the case in which there is no slow axis, an arbitrary in-plane direction of the film is used as the rotation axis), retardation values are measured in arbitrary two tilt directions, and based on the thus-determined retardation values, the assumed value of the average refractive index, and the input film thickness value, Rth can be calculated by the following Expressions (A) and (B).

$$Re(\theta) = \left[ nx - \frac{ny \times nz}{\sqrt{\left\{ny \sin\left(\sin^{-1}\left(\frac{\sin(-\theta)}{nx}\right)\right)\right\}^2 + \left(nz \cos\left(\sin^{-1}\left(\frac{\sin(-\theta)}{nx}\right)\right)\right)^2}}\right] \times \frac{d}{\cos\left\{\sin^{-1}\left(\frac{\sin(-\theta)}{nx}\right)\right\}}$$

Expression (A)

Re(θ) represents a retardation value in a direction tilted by an angle θ from the normal direction. In addition, in the Expression (A), nx represents a refractive index in the in-plane slow axis direction, ny represents a refractive index in the in-plane direction perpendicular to nx, and nz represents a refractive index in the direction perpendicular to nx and ny. d represents a thickness of a film to be measured.

$Rth=((nx+ny)/2-nz) \times d$  Expression (B)

In the case in which the film to be measured cannot be expressed by a uniaxial or biaxial index ellipsoid, that is, the film that does not have a so-called optical axis, Rth(λ) is calculated according to the following method. Rth(λ) is measured in the following method. Re(λ) is measured at eleven points by making light having a wavelength of λ nm incident on the film in each of the tilt directions of from −50° to +50° with a step of 10° with respect to the normal direction of the film with the in-plane slow axis (which is determined with KOBRA 21ADH or WR) as the tilt axis (rotation axis), and Rth(λ) is calculated with KOBRA 21ADH or WR based on the retardation values thus measured, the assumed value of the average refractive index, and the input film thickness value. In addition, in the aforementioned measurements, the assumed value of the average refractive index may be the values shown in Polymer Handbook (JOHN WILEY & SONS, INC) and the brochures of various optical films. For the film with an unknown average refractive index, the film may be measured for the average refractive index with an Abbe refractometer. Examples of the average refractive indices of the major optical films are shown below; cellulose acylate (1.48), cycloolefin polymer (1.52), polycarbonate (1.59), polymethyl methacrylate (1.49), and polystyrene (1.59). When the assumed value of the average refractive index and the film thickness are inputted, the values of nx, ny and nz are calculated with KOBRA 21ADH or WR. The Nz factor is further calculated by the relational expression of Nz=(nx−nz)/(nx−ny) based on the calculated values of nx, ny and nz.

In the present specification, the term "visible light" refers to light in a wavelength range of 380 to 780 nm. Further, in the present specification, the measurement wavelength is 550 nm unless otherwise specified regarding the measurement wavelength.

In the present specification, an angle (for example, an angle of "90°") and an angular relationship (for example, "orthogonal", "parallel", "45°", and "90°") include the margin of allowable error in the field of the related art to which the present invention belongs. At this time, the allowable error means that the margin of the error is less than a precise angle ±10°. Specifically, a difference between an actual angle and the precise angle is preferably 5° or less, and more preferably 3° or less. For example, in the case of being orthogonal, the margin of the error may be within a range of 90°±10° (80° to 100°).

In the present specification, the definitions of A-plate and C-plate are as follows.

There are two kinds of A-plates; a positive A-plate and a negative A-plate. When the refractive index in the in-plane slow axis direction of the film (the direction in which the refractive index becomes the maximum in the plane) is nx, the refractive index in an in-plane direction orthogonal to the in-plane slow axis is ny, and the refractive index in the thickness direction is nz, the positive A-plate satisfies the relationship of Expression (A1), and the negative A-plate satisfies the relationship of Expression (A2). Rth of the positive A-plate has a positive value and Rth of the negative A-plate has a negative value.

$nx > ny \cong nz$  Expression (A1)

$ny < nx \cong nz$  Expression (A2)

The term "≅" includes not only the case in which both are completely the same but also the case in which both are substantially the same. Regarding the term "substantially the same", for example, "ny≅nz" includes the case in which (ny−nz)×d (wherein d is a film thickness) is −10 to 10 nm, and preferably −5 to 5 nm and "nx≅nz" includes the case in which (nx−nz)×d is −10 to 10 nm and preferably −5 to 5 nm.

There are two kinds of C-plates; a positive C-plate and a negative C-plate. The positive C-plate satisfies the relationship of Expression (C1), and the negative C-plate satisfies the relationship of Expression (C2). Rth of the positive C-plate has a negative value and Rth of the negative C-plate has a positive value.

$$nz > nx \cong ny \quad \text{Expression (C1)}$$

$$nz < nx \cong ny \quad \text{Expression (C2)}$$

The term "≅" includes not only the case in which both are completely the same but also the case in which both are substantially the same. Regarding the term "substantially the same", for example, "nx≅ny" includes the case in which (nx−ny)×d (wherein d is a film thickness) is 0 to 10 nm and preferably 0 to 5 nm.

One feature of the circularly polarizing plate of the present invention is the provision of a cellulose acylate film in which each layer satisfies predetermined optical properties and one of the first C-plate and the second C-plate has a retardation Rth of 30 to 50 nm at a wavelength of 550 nm in the thickness direction. The visibility of black color in an oblique direction is improved by satisfying the above requirements. The cellulose acylate film itself having the above Rth has a relatively small thickness and thus thinning of the circularly polarizing plate is achieved.

In WO2013/137464A, a cellulose acylate film of which Rth has a positive (plus) and high value is used but such a film has a large thickness and is not suitable for thinning of a circularly polarizing plate. In addition, a cellulose acylate film of which Rth has a negative (minus) is also used. However, the addition of large amounts of additives and the like to such a film causes deterioration in handleability, an increase in costs, which is not preferable industrially.

First Embodiment

Figure 1:
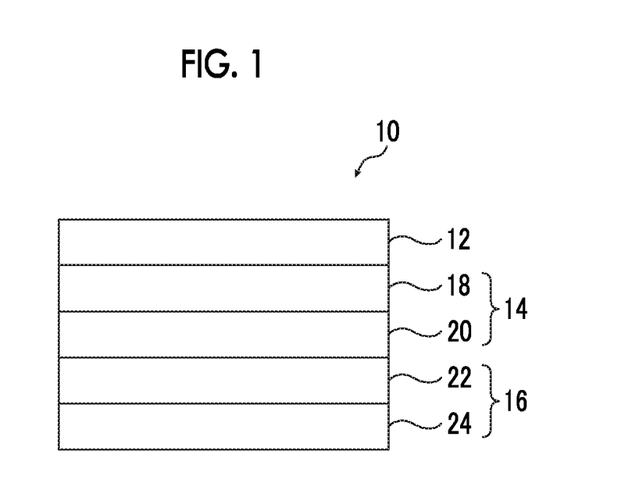
FIG. 1 is a cross-sectional view showing a first embodiment of a circularly polarizing plate according to the present invention.

Hereinafter, a first embodiment of a circularly polarizing plate of the present invention will be described with reference to drawings. FIG. 1 is a cross-sectional view showing a first embodiment of a circularly polarizing plate according to the present invention. The drawings in the present invention are schematic and not always identical to actual ones in terms of the thickness relationship and positional relationship of each layer. The same is applied to the followings.

A circularly polarizing plate 10 has a polarizer 12, a λ/2 plate 14, and a λ/4 plate 16 in this order. The λ/2 plate 14 is formed of a first C-plate 18 and a first A-plate 20, and the λ/4 plate 16 is formed of a second C-plate 22 and a second A-plate 24. The λ/2 plate 14 and the λ/4 plate 16 forms a so-called broadband λ/4 plate (a phase difference film having a ¼ phase difference value with respect to each wavelength).

Hereinafter, each member included in the circularly polarizing plate 10 will be described in detail.

(Polarizer)

The polarizer 12 may be a member having a function of converting light into specific linearly polarized light (linear polarizer) and an absorptive type polarizer and a reflective type polarizer can be mainly used.

As the absorptive type polarizer, an iodine-based polarizer, a dye-based polarizer using a dichroic dye, a polyene-based polarizer, and the like are used. The iodine-based polarizer and the dye-based polarizer are a coating type polarizer and a stretching type polarizer, any one of these polarizers can be applied, and a polarizer, which is prepared by allowing polyvinyl alcohol to adsorb iodine or a dichroic dye, and performing stretching, is preferable.

In addition, examples of a method of obtaining a polarizer by performing stretching and dyeing in a state of a laminated film in which a polyvinyl alcohol layer is formed on a substrate include methods disclosed in JP5048120B, JP5143918B, JP4691205B, JP4751481B, and JP4751486B, and known technologies related to these polarizers can be preferably used.

As the reflective type polarizer, a polarizer in which thin films having different birefringence are laminated, a wire grid type polarizer, a polarizer in which a cholesteric liquid crystal having a selective reflection range and a ¼ wavelength plate are combined, and the like are used.

Among these, from the viewpoint of handleability, a polarizer containing a polyvinyl alcohol-based resin (a polymer including —$CH_2$—CHOH— as a repeating unit, in particular, at least one selected from the group consisting of polyvinyl alcohol and an ethylene-vinyl alcohol copolymer is preferable) is preferable.

The thickness of the polarizer 12 is not particularly limited but from the viewpoint of achieving excellent handleability and excellent optical properties, the thickness is preferably 35 μm or less, more preferably 3 to 25 μm, and even more preferably 4 to 20 μm. Within the thickness range, a display device can be made thin.

(λ/2 Plate)

The λ/2 plate 14 is formed of a first C-plate 18 and a first A-plate 20.

The λ/2 plate 14 refers to an optically anisotropic layer of which the in-plane retardation Re(λ) at a predetermined wavelength λ nm satisfies Re(λ)≅λ/2. This expression may be satisfied at a wavelength in a visible light range (for example, 550 nm). In the present invention, the in-plane retardation Re1 of the λ/2 plate 14 is set to be substantially double the in-plane retardation Re2 of the λ/4 plate 16, which will be described later. Here, the term "substantially double" means that the following relationship is satisfied.

$$Re1 = 2 \times Re2 \pm 50 \text{ nm}$$

In the relationship, it preferable that a relationship of Re1=2×Re2±20 nm is satisfied and it is more preferable that a relationship of Re1=2×Re2±10 nm is satisfied.

In the case in which Rth of the λ/2 plate 14 at a wavelength of 550 nm is negative, an angle formed between the slow axis direction of the λ/2 plate 14 (or the first A-plate 20) and the absorption axis direction of the polarizer 12 is preferably within a range of 75°±8°, more preferably within a range of 75°±6°, and even more preferably within a range of 75°±3°.

In addition, in the case in which Rth of the λ/2 plate 14 at a wavelength of 550 nm is positive, an angle formed between the slow axis direction of the λ/2 plate 14 (or the first A-plate 20) and the absorption axis direction of the polarizer 12 is preferably within a range of 15°±8°, more preferably within a range of 15°±6°, and even more preferably within a range of 15°±3°.

The angle means an angle formed between the absorption axis of the polarizer 12 and the in-plane slow axis of the λ/2 plate 14 when viewed in the normal direction of the surface of the polarizer 12.

(λ/4 Plate)

The λ/4 plate 16 is formed of a second C-plate 22 and a second A-plate 24.

The λ/4 plate 16 is A-plate having a function of converting linearly polarized light having a specific wavelength into circularly polarized light (or circularly polarized light into linearly polarized light) and refers to an optically anisotropic layer of which the in-plane retardation Re(λ) at a specific wavelength λ nm satisfies Re(λ)≅λ/4. This expression may be satisfied at a wavelength in a visible light range (for example, 550 nm) but it is preferable that the in-plane retardation Re(550) at a wavelength of 550 nm satisfies the following relationship.

$$115 \text{ nm} \leq Re(550) \leq 155 \text{ nm}$$

In the relationship, it is more preferable that a relationship of 120 nm≤Re(550)≤145 nm is satisfied.

In the case in which Rth of the λ/2 plate 14 at a wavelength of 550 nm is negative, an angle formed between the slow axis direction of the λ/4 plate 16 (or the second A-plate 24) and the absorption axis direction of the polarizer 12 is preferably within a range of 15°±8°, more preferably within a range of 15°±6°, and even more preferably within a range of 15°±3°.

In addition, in the case in which Rth of the λ/2 plate 14 at a wavelength of 550 nm is positive, an angle formed between the slow axis direction of the λ/4 plate 16 (or the second A-plate 24) and the absorption axis direction of the polarizer 12 is preferably within an range of 75°±8°, more preferably within a range of 75°±6°, and even more preferably within a range of 75°±3°.

The angle means an angle formed between the absorption axis of the polarizer 12 and the in-plane slow axis of the λ/4 plate 16 when viewed from the normal direction of the surface of the polarizer 12.

(First C-Plate and Second C-Plate)

The λ/2 plate 14 includes the first C-plate 18 and the λ/4 plate 16 includes the second C-plate 22.

The definition of C-plate is as described above.

One of the first C-plate 18 and the second C-plate 22 is a cellulose acylate film of which the retardation Rth in the thickness direction at a wavelength of 550 nm is 30 to 50 nm (hereinafter, also simply referred to as "cellulose acylate film A"). In addition, the other of the first C-plate 18 and the second C-plate 22 is an optically anisotropic layer including a liquid crystal compound of which the retardation Rth in the thickness direction at a wavelength of 550 nm is −60 to −30 nm (hereinafter, also simply referred to as "optically anisotropic layer B").

That is, there are two combinations of the first C-plate 18 and the second C-plate 22 as shown below.

(Combination 1): The first C-plate 18 is a cellulose acylate film A and the second C-plate 22 is an optically anisotropic layer B.

(Combination 2): The first C-plate 18 is an optically anisotropic layer B and the second C-plate 22 is a cellulose acylate film A.

Hereinafter, the cellulose acylate film A and the optically anisotropic layer B will be described in detail.

(Cellulose Acylate Film A)

The retardation Rth of the cellulose acylate film A is 30 to 50 nm in the thickness direction at a wavelength of 550 nm and from the viewpoint of further improving the visibility of black color in the oblique direction (hereinafter, also simply referred to as "from the viewpoint of further improving the effect of the present invention"), the retardation Rth is preferably 35 to 45 nm and more preferably 38 to 42 nm.

The in-plane retardation Re of the cellulose acylate film A at a wavelength of 550 nm is not particularly limited but from the viewpoint of further improving the effect of the present invention, the in-plane retardation Re is preferably 0 to 10 nm and more preferably 0 to 5 nm.

The cellulose acylate used as the material for the cellulose acylate film A may be, for example, cellulose acylate formed of only an acetyl group, or a composition including cellulose acylate having a plurality of acyl substituents may be used.

An example of cellulose acylate has a total acylation degree of preferably 2.3 to 3.0 and more preferably 2.4 to 2.95.

In addition, a mixed fatty acid ester having another fatty acid ester residue with an acetyl group is also preferable. The aliphatic acyl group of the fatty acid ester residue preferably has 2 to 20 carbon atoms and specific examples thereof include an acetyl group, a propionyl group, a butylyl group, an isobutyryl group, a valeryl group, a pivaloyl group, a hexanoyl group, an octanoyl group, a lauroyl group, and a stearoyl group. Among these, cellulose acylate having an acyl group selected from a propionyl group, a butylyl group, a pentanoyl group, and a hexanoyl group with an acetyl group is preferable.

The cellulose acylate preferably has a mass average polymerization degree of 350 to 800 and more preferably has a mass average polymerization degree of 370 to 600. In addition, the cellulose acylate used in the present invention preferably has a number average molecular weight of 70,000 to 230,000 more preferably has a number average molecular weight of 75,000 to 230,000, and even more preferably has a number average molecular weight of 78,000 to 120,000.

The cellulose acylate film A is preferably produced by a solution casting method or a melt casting method. A production example of the cellulose acylate film using the solvent casting method is able to refer to the specification of each of U.S. Pat. No. 2,336,310A, U.S. Pat. No. 2,367,603A, U.S. Pat. No. 2,492,078A, U.S. Pat. No. 2,492,977A, U.S. Pat. No. 2,492,978A, U.S. Pat. No. 2,607,704A, U.S. Pat. No. 2,739,069A, and U.S. Pat. No. 2,739,070A, the specification of each of GB640731B and GB736892B, and JP1970-4554B (JP-S45-4554B), JP1974-5614B (JP-S49-5614B), JP1985-176834A (JP-S60-176834A), JP1985-203430A (JP-S60-203430A), JP-1987-115035A (JP-S62-115035A), and the like.

The cellulose acylate film A may include various additives (such as a compound for lowering optical anisotropy, a retardation increasing agent, a wavelength dispersion controlling agent, an ultraviolet rays protective agent, a plasticizer, a deterioration inhibitor, fine particles, an optical property adjusting agent, and an ultraviolet absorbent).

The thickens of the cellulose acylate film A is not particularly limited as long as Rth is satisfied but from the viewpoint of thinning, the thickness is preferably 10 to 100 μm and more preferably 20 to 60 μm.

(Optically Anisotropic Layer B)

The retardation Rth of the optically anisotropic layer B in the thickness direction at a wavelength of 550 nm is −60 to −30 nm, and from the viewpoint of further improving the effect of the present invention, the retardation Rth is preferably −50 to −30 nm.

The in-plane retardation Re of the optically anisotropic layer B at a wavelength of 550 nm is not particularly limited but from the viewpoint of further improving the effect of the present invention, the in-plane retardation Re is preferably 0 to 10 nm and more preferably 0 to 5 nm.

The optically anisotropic layer B includes a liquid crystal compound. More specifically, the optically anisotropic layer B corresponds to a layer including a homeotropic aligned liquid crystal compound. The homeotropic alignment refers to an alignment state in which the major axis direction formed by the liquid crystal compound is vertical to the plane.

The type of liquid crystal compound is not particularly limited but liquid crystal compounds can be classified into a rod-shaped type (rod-like liquid crystal compound) and a disc-shaped type (disk-like liquid crystal compound, discotic liquid crystal compound) on the basis of the shape thereof. Further, each type includes a low molecular type and a high molecular type. A high molecule generally indicates a molecule having a polymerization degree of 100 or more (Masao Doi; Polymer Physics-Phase Transition Dynamics, 1992, IWANAMI SHOTEN, PUBLISHERS, page 2). In the present invention, any type of liquid crystal compound can be used. A mixture of two types or more of rod-like liquid crystal compounds, two types or more of disk-like liquid crystal compounds, or a rod-like liquid crystal compound and a disk-like liquid crystal compound may be used. Among these, from the viewpoint of further improving the effect of the present invention, a rod-like liquid crystal compound is preferable.

As the rod-like liquid crystal compound, for example, it is possible to preferably use those described in claim 1 of JP1999-513019A (JP-H11-513019A) or in paragraphs [0026] to [0098] of JP2005-289980A. As the discotic liquid crystal compound, for example, it is possible to preferably use those described in paragraphs [0020] to [0067] of JP2007-108732A or in paragraphs [0013] to [0108] of JP2010-244038A. However, the present invention is not limited thereto.

It is more preferable to form the optically anisotropic layer B using a liquid crystal compound (rod-like liquid crystal compound or disk-like liquid crystal compound) having a polymerizable group since changes in temperature and humidity in optical properties can be made small. The liquid crystal compound may be a mixed compound of two or more types. In this case, it is preferable that at least one has two or more polymerizable groups.

That is, it is preferable that the optically anisotropic layer B is a layer formed by fixing a rod-like liquid crystal compound having a polymerizable group or a disk-like liquid crystal compound having a polymerizable group through polymerization. In this case, after the layer is formed, the liquid crystal compound does not need to exhibit liquid crystallinity.

The type of polymerizable group included in the rod-like liquid crystal compound or the disk-like liquid crystal compound is not particularly limited and a functional group capable of causing an addition polymerization reaction is preferable. A polymerizable ethylenically unsaturated group or a cyclic polymerizable group is preferable. More specifically, a (meth)acryloyl group, a vinyl group, a styryl group, and an allyl group are preferable and a (meth)acryloyl group is more preferable. The (meth)acryloyl group is a concept including both a methacryloyl group and an acryloyl group.

The method of forming the optically anisotropic layer B is not particularly limited and a known method may be used.

For example, a coating film is formed by applying an optically anisotropic layer forming composition including a liquid crystal compound having a polymerizable group (hereinafter, also simply referred to as "composition") to a predetermined substrate (including a temporary substrate) and the obtained coating film is subjected to a curing treatment (irradiation with ultraviolet rays (light irradiation treatment) or heating treatment) so that an optically anisotropic layer B can be produced. If required, an alignment layer, which will be described later, may be used.

The composition can be applied by a known method (for example, a wire bar coating method, an extrusion coating method, a direct gravure coating method, a reverse gravure coating method, or a die coating method).

The composition may include components other than the above liquid crystal compound.

For example, the composition may include a polymerization initiator. The polymerization initiator to be used is selected according to the polymerization reaction mode and examples thereof include a thermal polymerization initiator and a photopolymerization initiator. Examples of the photopolymerization initiator include an α-carbonyl compound, acyloin ether, an α-hydrocarbon-substituted aromatic acyloin compound, a polynuclear quinone compound, and a combination of triaryl imidazole dimer and p-aminophenylketone.

The amount of the polymerization initiator used is preferably 0.01% to 20% by mass and more preferably 0.5% to 5% by mass with respect to the total solid content of the composition.

In addition, the composition may include a polymerizable monomer from the viewpoint of evenness of a coating film and film strength.

Examples of the polymerizable monomer include a radical polymerizable or a catatonical polymerizable compound. Preferable is a polyfunctional radical polymerizable monomer, and a monomer copolymerizable with the liquid crystal compound having a polymerizable group is more preferable. For example, those described in paragraphs [0018] to [0020] of JP2002-296423A may be used.

The amount of the polymerizable monomer added is preferably 1% to 50% by mass and more preferably 2% to 30% by mass with respect to the total mass of the liquid crystal compound.

In addition, the composition may include a surfactant from the viewpoint of evenness of a coating film and film strength.

As the surfactant, a conventionally known compound may be used and a fluorine-based compound is particularly preferable. Specific examples thereof include compounds described in paragraphs [0028] to [0056] of JP2001-330725A, and compounds described in paragraphs [0069] to [0126] of JP2003-295212A.

In addition, the composition may include a solvent and an organic solvent is preferably used. Examples of the organic solvent include amides (for example, N,N-dimethylformamide), sulfoxides (for example, dimethylsulfoxide), heterocyclic compounds (for example, pyridine), hydrocarbons (for example, benzene, hexane), alkyl halides (for example, chloroform, and dichloromethane), esters (for example, methyl acetate, ethyl acetate, and butyl acetate), ketones (for example, acetone, and methyl ethyl ketone), and ethers (for example, tetrahydrofuran, and 1,2-dimethoxyethane). Alkyl halides and ketones are preferable. These organic solvents may be used alone or in combination of two or more thereof.

In addition, the composition may include various aligning agents such as a vertical alignment promoter, such as a polarizer interface side vertical aligning agent or an air interface side vertical aligning agent, and a horizontal alignment promoter, such as a polarizer interface side horizontal aligning agent or an air interface side horizontal aligning agent.

Further, the composition may include an adhesion improver, a plasticizer, a polymer and the like, in addition to the above components.

The thickness of the optically anisotropic layer B is not particularly limited as long as Rth is satisfied, but from the viewpoint of thinning, the thickness is preferably 1 to 10 μm and more preferably 2 to 5 μm.

(First A-Plate and Second A-Plate)

The λ/2 plate 14 includes the first A-plate 20 and the λ/4 plate 16 includes the second A-plate 24.

The definition of A-plate is as described above.

The retardation Rth of the first A-plate 20 in the thickness direction at a wavelength of 550 nm is not particularly limited as long as the relationships of Expressions (1) to (4), which will be described later, are satisfied. However, from the viewpoint of further improving the effect of the present invention, in the case in which the first A-plate 20 is a negative A-plate, Rth is preferably −140 to −110 nm and more preferably −130 to −120 nm, and in the case in which the first A-plate 20 is a positive A-plate, Rth is preferably 110 to 140 nm and more preferably 120 to 130 nm.

The in-plane retardation Re of the first A-plate 20 at a wavelength of 550 nm is not particularly limited as long as the relationships of Expressions (1) to (4), which will be described later, are satisfied. However, from the viewpoint of further improving the effect of the present invention, the in-plane retardation Re is preferably 220 to 280 nm and more preferably 240 to 260 nm.

The retardation Rth of the second A-plate 24 in the thickness direction at a wavelength of 550 nm is not particularly limited as long as the relationships of Expressions (1) to (4), which will be described later, are satisfied. However, from the viewpoint of further improving the effect of the present invention, in the case in which the second A-plate 24 is a negative A-plate, Rth is preferably −73 to −50 nm and more preferably −68 to −58 nm, and in the second A-plate 24 is a positive A-plate, Rth is preferably 50 to 73 nm and more preferably 58 to 68 nm.

In addition, the in-plane retardation Re of the second A-plate 24 at a wavelength of 550 nm is not particularly limited as long as the relationships of Expressions (1) to (4), which will be described later, are satisfied. However, from the viewpoint of further improving the effect of the present invention, the in-plane retardation Re is preferably 105 to 145 nm and more preferably 115 to 125 nm.

The materials for constituting the first A-plate 20 and the second A-plate 24 are not particularly limited as long as the above properties are satisfied. As mentioned in the above description of the first C-plate 18 and the second C-plate 22, an embodiment including a liquid crystal compound (for example, an optically anisotropic layer including a homogeneously aligned liquid crystal compound), a polymer film, and the like may be used. Among these, from the viewpoint of easily controlling the above properties, a material including a liquid crystal compound is preferable and from the viewpoint of further improving the effect of the present invention, a material including a discotic liquid crystal compound is more preferable. More specifically, it is preferable that the first A-plate 20 and the second A-plate 24 are layers formed by fixing a liquid crystal compound (rod-like liquid crystal compound or disk-like liquid crystal compound) having a polymerizable group through polymerization. In this case, after the layer is formed, the liquid crystal compound does not need to exhibit liquid crystallinity.

In the circularly polarizing plate having the above-described configuration, in the case in which the first A-plate 20 is a negative A-plate, the following Expressions (1) and (2) are satisfied.

$$0 < Nz \text{ factor of } \lambda/2 \text{ plate } 14 \leq 0.35 \quad \text{Expression (1)}$$

$$0.65 \leq Nz \text{ factor of } \lambda/4 \text{ plate } 16 < 1 \quad \text{Expression (2)}$$

Among these, from the viewpoint of further improving the effect of the present invention, it is preferable that the following Expressions (1-A) and (2-A) are satisfied.

$$0.13 < Nz \text{ factor of } \lambda/2 \text{ plate } 14 \leq 0.20 \quad \text{Expression (1-A)}$$

$$0.65 < Nz \text{ factor of } \lambda/4 \text{ plate } 16 < 0.75 \quad \text{Expression (2-A)}$$

In addition, in the case in which the first A-plate 20 is a positive A-plate, the following Expressions (3) and (4) are satisfied.

$$0.65 < Nz \text{ factor of } \lambda/2 \text{ plate } 14 < 1.0 \quad \text{Expression (3)}$$

$$0 < Nz \text{ factor of } \lambda/4 \text{ plate } 16 < 0.35 \quad \text{Expression (4)}$$

Among these, from the viewpoint of further improving the effect of the present invention, it is preferable that the following Expressions (3-A) and (4-A) are satisfied.

$$0.80 < Nz \text{ factor of } \lambda/2 \text{ plate } 14 < 0.90 \quad \text{Expression (3-A)}$$

$$0.30 < Nz \text{ factor of } \lambda/4 \text{ plate } 16 \leq 0.35 \quad \text{Expression (4-A)}$$

The thickness of the circularly polarizing plate 10 is not particularly limited but from the viewpoint of thinning, the thickness is preferably 100 µm or less and more preferably 60 µm or less. The lower limit is not particularly limited but from the viewpoint of handleability, the lower limit is preferably 20 µm or more and more preferably 30 µm or more.

(Other Layers)

The circularly polarizing plate 10 may include layers other than the polarizer 12, the λ/2 plate 14, and the λ/4 plate 16, within a range not impairing the effect of the present invention.

For example, the circularly polarizing plate 10 may include an alignment film having a function of determining the alignment direction of the liquid crystal compound.

The alignment film has generally a polymer as a main component. The polymer materials for the alignment film are mentioned in a large number of literatures, and a large number of commercial products are available. The polymer material used is preferably polyvinyl alcohol or polyimide, and derivatives thereof. Particularly, modified or unmodified polyvinyl alcohols are preferable. Regarding the alignment film that can be used in the present invention, the modified polyvinyl alcohols described in WO01/88574A1, from page 43, line 24 to page 49, line 8, and paragraphs [0071] to [0095] of JP3907735B can be referred to.

The alignment film is typically subjected to a known rubbing treatment. That is, the alignment film is preferably a rubbed alignment film which is subjected to a rubbing treatment.

The thickness of the alignment film is preferably 0.01 to 10 µm, more preferably 0.01 to 1 µm, and even more preferably 0.01 to 0.5 µm.

In addition, a polarizer protective film may be arranged in the circularly polarizing plate 10. The configuration of the polarizer protective film is not particularly limited. The polarizer protective film may be, for example, a so-called transparent support, a hard coat layer, or a laminate of a transparent support and a hard coat layer. As the transparent support, a known transparent support can be used and for example, as the material for constituting the transparent support, a cellulose-based polymer (hereinafter, referred to as cellulose acylate) typified as triacetyl cellulose and a thermoplastic norbornene-based resin (ZEONEX and ZEONOR, manufactured by Zeon Corporation, ARTON, manufactured by JSR Corporation, or the like), an acrylic resin, and a polyester-based resin may be used.

In addition, in order to secure adhesiveness between each layer, an adhesive layer between each layer may be arranged.

(Applications)

The circularly polarizing plate of the present invention can be applied to various applications. For example, the circularly polarizing plate is suitably used for antireflection for image display devices such as an organic electroluminescence (EL) display device (ELD), a liquid crystal display device (LCD), a plasma display panel (PDP), and a cathode tube display device (CRT).

The case of an organic EL display device including the circularly polarizing plate of the present invention will be described in detail below.

(Organic EL Display Device)

Figure 2:
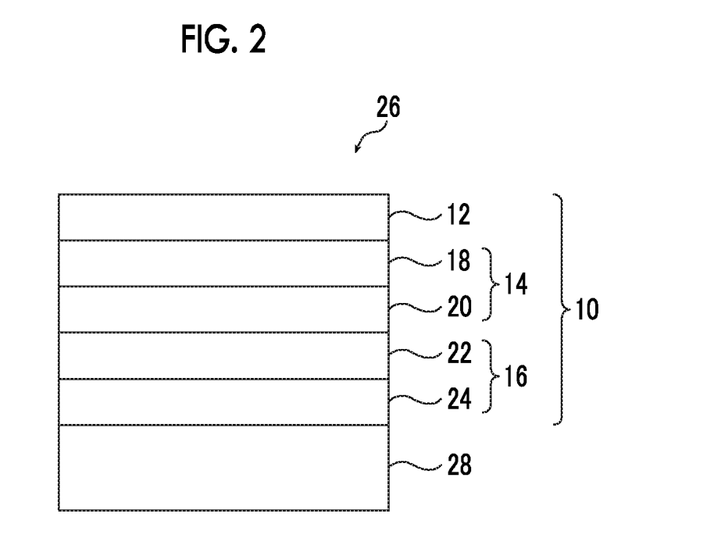
FIG. 2 is a cross-sectional view showing an embodiment of an organic EL display device according to the present invention.

The organic EL display device of the present invention has the aforementioned circularly polarizing plate. Typically, the circularly polarizing plate is provided on the organic EL panel of the organic EL display device. More specifically, as shown in FIG. 2, an organic EL display device 26 has at least an organic EL panel 28, and the circularly polarizing plate 10. The configuration of the circularly polarizing plate 10 is as described above.

The organic EL panel 28 is a member in which a light emitting layer or plural organic compound thin films including a light emitting layer are formed between one pair of electrodes of anode and cathode and may have a hole injecting layer, a hole transporting layer, an electron injecting layer, an electron transporting layer and a protective layer, in addition to the light emitting layer.

Second Embodiment

Figure 3:
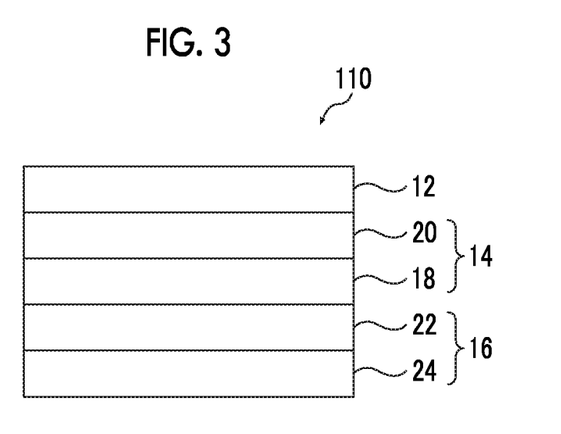
FIG. 3 is a cross-sectional view showing a second embodiment of the circularly polarizing plate according to the present invention.

Hereinafter, a second embodiment of the circularly polarizing plate according to the present invention will be described with reference to a drawing. FIG. 3 is a cross-sectional showing a second embodiment of the circularly polarizing plate according to the present invention.

A circularly polarizing plate 110 includes a polarizer 12, a first A-plate 20, a first C-plate 18, a second C-plate 22, and a second A-plate 24 in this order. The first A-plate 20 and the first C-plate 18 form a λ/2 plate 14 and the second C-plate 22 and the second A-plate 24 form a λ/4 plate 16.

The circularly polarizing plate 110 shown in FIG. 3 has the same layers as in the circularly polarizing plate 10 shown in FIG. 1 except that the order of the first A-plate 20 and the first C-plate 18 is different. The same reference numerals are assigned to the same components and the detail descriptions thereof will be omitted.

The circularly polarizing plate 110 satisfies the relationships of Expressions (1) and (2) or the relationships of Expressions (3) or (4) similar to the aforementioned circularly polarizing plate 10 and exhibits desired effects.

Third Embodiment

Figure 4:
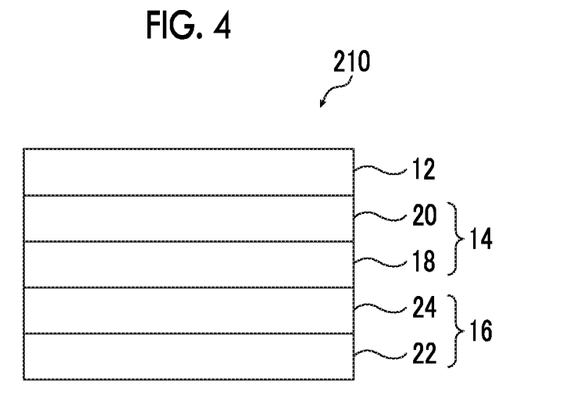
FIG. 4 is a cross-sectional view showing a third embodiment of the circularly polarizing plate according to the present invention.

Hereinafter, a third embodiment of the circularly polarizing plate according to the present invention will be described with reference to a drawing. FIG. 4 is a cross-sectional view showing a third embodiment of the circularly polarizing plate according to the present invention.

A circularly polarizing plate 210 includes a polarizer 12, a first A-plate 20, a first C-plate 18, a second A-plate 24, and a second C-plate 22 in this order. The first A-plate 20 and the first C-plate 18 form a λ/2 plate 14 and the second A-plate 24 and the second C-plate 22 form a λ/4 plate 16.

The circularly polarizing plate 210 shown in FIG. 4 has the same layers as in the circularly polarizing plate 10 shown in FIG. 1 except that the order of each layer is different. The same reference numerals are assigned to the same components and the detail descriptions thereof will be omitted.

The circularly polarizing plate 210 satisfies the relationships of Expressions (1) and (2) or the relationships of Expressions (3) or (4) similar to the aforementioned circularly polarizing plate 10 and exhibits desired effects.

Fourth Embodiment

Figure 5:
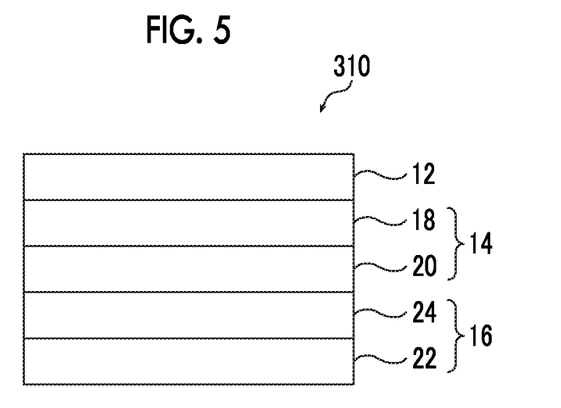
FIG. 5 is a cross-sectional view showing a fourth embodiment of the circularly polarizing plate according to the present invention.

Hereinafter, a fourth embodiment of the circularly polarizing plate according to the present invention will be described with reference to a drawing. FIG. 5 is a cross-sectional view showing a fourth embodiment of the circularly polarizing plate according to the present invention.

A circularly polarizing plate 310 includes a polarizer 12, a first C-plate 18, a first A-plate 20, a second A-plate 24, and a second C-plate 22 in this order. The first A-plate 20 and the first C-plate 18 forms a λ/2 plate 14 and the second A-plate 24 and the second C-plate 22 forms λ/4 plate 16.

The circularly polarizing plate 310 shown in FIG. 5 has the same layers as in the circularly polarizing plate 10 shown in FIG. 1 except that the order of the second A-plate 24 and the second C-plate 22 is different. The same reference numerals are assigned to the same components and the detail descriptions thereof will be omitted.

The circularly polarizing plate 310 satisfies the relationships of Expressions (1) and (2) or the relationships of Expressions (3) or (4) similar to the aforementioned circularly polarizing plate 10 and exhibits desired effects.

EXAMPLES

The present invention will be described in more detail with reference to the following Examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

(1-1) Preparation of Cellulose Acylate Film

The following composition was put into a mixing tank and was stirred while being heated to dissolve the respective components, thereby preparing a cellulose acylate solution A.

| Composition of Cellulose Acylate Solution A | |
|---|---|
| Cellulose acetate having a degree of substitution of 2.86 | 100 parts by mass |
| Triphenyl phosphate (plasticizer) | 7.8 parts by mass |
| Biphenyldiphenyl phosphate (plasticizer) | 3.9 parts by mass |
| Methylene chloride (first solvent) | 300 parts by mass |
| Methanol (second solvent) | 54 parts by mass |
| 1-Butanol | 11 parts by mass |

Into another mixing tank, the following composition was put and stirred while being heated to dissolve the respective components, thereby preparing an additive solution B.

| Composition of Additive Solution B | |
|---|---|
| Compound B1 below (Re reducing agent) | 40 parts by mass |
| Compound B2 below (wavelength dispersion controlling agent) | 4 parts by mass |

-continued

| Composition of Additive Solution B | |
|---|---|
| Methylene chloride (first solvent) | 80 parts by mass |
| Methanol (second solvent) | 20 parts by mass |

Compound B1

Compound B2

To 477 parts by mass of the cellulose acylate solution A, 40 parts by mass of the additive solution B was added and sufficiently stirred to prepare a dope. The dope was cast on a drum cooled to 0° C. from a casting port. The film was peeled off from the drum in the state in which the solvent content was 70% by mass, and after fixing both ends in the crosswise direction of the film by a pin tenter (the pin tenter described in FIG. 3 of JP1992-1009A (JP-H04-1009A)), the film was dried while keeping the distance of giving a stretch percentage of 3% in the crosswise direction (the direction vertical to the machine direction) in a stet in which the solvent content was 3% to 5% by mass. Thereafter, the film was further dried by transporting the film between rolls of a heat treatment device to prepare a cellulose acylate film having a thickness of 40 μm.

The cellulose acylate film did not contain an ultraviolet absorbent, Re(550) was 1.0 nm, and Rth(550) was 40.3 nm.

(1-2) Preparation of λ/2 Plate (Alkali Saponification Treatment)

The aforementioned cellulose acylate film was allowed to pass between induction heating rolls at a temperature of 60° C. to increase the surface temperature of the film to 40° C. Then, an alkali solution of the following composition was applied to the band surface of the film in a coating amount of 14 ml/m² using a bar coater. The film was then transported for 10 seconds under a steam type infrared ray heater (manufactured by NORITAKE Co., Limited) heated to 110° C. Subsequently, pure water was applied in an amount of 3 ml/m² similarly using a bar coater. Next, after repeating 3 times the procedures of washing with water by a fountain coater and removing water by an air knife, the film was transported to a 70° C. drying zone to be dried for 10 seconds, and thus a cellulose acylate film subjected to an alkali saponification treatment was prepared.

| Composition of Alkali Solution | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(Formation of Alignment Film)

An alignment film coating liquid (A) having the following composition was continuously applied to the surface of the cellulose acylate film, which had been subjected to the alkali saponification treatment, using a #14 wire bar. The coated film was dried for 60 seconds with hot air at 60° C. and further dried for 120 seconds with hot air at 100° C. The saponification degree of modified polyvinyl alcohol used was 96.8%.

| Composition of Alignment Film Coating Liquid (A) | |
|---|---|
| Modified polyvinyl alcohol-1 below | 10 parts by mass |
| Water | 308 parts by mass |
| Methanol | 70 parts by mass |
| Isopropanol | 29 parts by mass |
| Photopolymerization initiator (IRGACURE 2959, manufactured by BASF SE) | 0.8 parts by mass |

[Modified Polyvinyl Alcohol-1]

(Formation of Optically Anisotropic Layer A (Negative A-Plate))

The prepared alignment film was continuously subjected to a rubbing treatment. At this time, the longitudinal direction of the long film was parallel to the transport direction and an angle formed between the longitudinal direction of the film and the rotation axis of the rubbing roller was 75° (clockwise) (when the longitudinal direction of the film was 90°, the angle of the rotation axis of the rubbing roller was 15°).

An optically anisotropic layer coating liquid (A) including a discotic liquid crystal compound and having the following composition was continuously applied to the prepared alignment film using a #5.0 wire bar. The transport velocity (V) of the film was 26 m/min. In order to dry the solvent of the coating liquid and to align and age the discotic liquid crystal compound, the coating film was heated for 90 seconds by hot air at 130° C. and subsequently heated for 60 seconds by hot air at 100° C. Then, ultraviolet (UV) irradiation was performed on the film at a temperature of 80° C. and the alignment of the discotic liquid crystal compound was fixed to prepare an optically anisotropic layer A. The thickness of the optically anisotropic layer A was 2.0 μm. It was confirmed that the average tilt angle of the plane of the disk of the discotic liquid crystal compound to the plane of the film was 90° and the discotic liquid crystal compound was aligned to be vertical to the plane of the film. In addition, the angle of the slow axis was parallel to the rotation axis of the rubbing roller and was 15° when the longitudinal direction of the film was 90° (the width direction of the film was 0°).

Through the above procedures, a λ/2 plate including the cellulose acylate film (C-plate) and the optically anisotropic layer A (negative A-plate) was produced.

| Composition of Optically Anisotropic Layer Coating Liquid (A) | |
|---|---|
| Discotic liquid crystal compound-1 | 80 parts by mass |
| Discotic liquid crystal compound-2 | 20 parts by mass |
| Alignment film interface aligning agent-1 | 0.55 parts by mass |

| Composition of Optically Anisotropic Layer Coating Liquid (A) | |
|---|---|
| Alignment film interface aligning agent-2 | 0.05 parts by mass |
| Fluorine-containing compound (FP-1) | 0.1 parts by mass |
| Modified trimethylolpropane triacrylate | 10 parts by mass |
| Photopolymerization initiator (IRGACURE 907, manufactured by BASF SE) | 3.0 parts by mass |
| Methyl ethyl ketone | 200 parts by mass |

[Discotic Liquid Crystal Compound-1]

[Discotic Liquid Crystal Compound-2]

[Alignment Film Interface Aligning Agent-1]

[Alignment Film Interface Aligning Agent-2]

[Fluorine-Containing Compound (FP-1)]

| Composition of Optically Anisotropic Layer Coating Liquid (A) | |
|---|---|

(1-3) Preparation of Optically Anisotropic Layer B (C-Plate)

(Preparation of Peelable Support)

An alignment film was prepared without performing the alkali saponification treatment on the cellulose acylate film and thus a peelable support was prepared.

(Formation of Alignment Film)

An alignment film coating liquid (B) having the following composition was continuously applied to the cellulose acylate film using a #14 wire bar. The film was dried for 60 seconds by hot air at 60° C. and further dried for 120 seconds by hot air of 100° C.

| Composition of Optically Anisotropic Layer Coating Liquid (B) | |
|---|---|
| Modified poly-vinyl alcohol-2 below | 10 parts by mass |
| Water | 371 parts by mass |
| Methanol | 119 parts by mass |
| Glutaraldehyde (crosslinking agent) | 0.5 parts by mass |
| Citric acid ester (AS3, manufactured by manufactured by Sankyo Chemical Industry Co., Ltd.) | 0.175 parts by mass |
| Photopolymerization initiator (IRGACURE 2959, manufactured by BASF SE) | 2.0 parts by mass |

[Modified Polyvinyl Alcohol-2]

(Preparation of Optically Anisotropic Layer B (Positive C-Plate))

An optically anisotropic layer coating liquid (B) including rod-like liquid crystal compounds and having the following composition was continuously applied to the prepared alignment film using a #5.0 wire bar. The transport velocity (V) of the film was 26 m/min. In order to dry the solvent of the coating liquid and to align and age the rod-like liquid crystal compounds, the coating liquid was heated for 60 seconds by hot air at a temperature of 60° C. and subjected to UV irradiation at 60° C. to fix the alignment of the rod-like liquid crystal compounds. Thus, an optically anisotropic layer B was prepared. The thickness of the optically anisotropic layer B was 3.0 μm.

| Composition of Optically Anisotropic Layer Coating Liquid (B) | |
|---|---|
| Rod-like liquid crystal compound-1 | 80 parts by mass |
| Rod-like liquid crystal compound-2 | 20 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |

-continued

| Composition of Optically Anisotropic Layer Coating Liquid (B) | |
|---|---|
| Fluorine-containing compound (FP-2) | 0.3 parts by mass |
| Alignment film interface aligning agent-1 | 0.55 parts by mass |
| Methyl ethyl ketone | 193 parts by mass |

[Rod-Like Liquid Crystal Compound-1]

[Rod-Like Liquid Crystal Compound-2]

[Fluorine-containing compound (FP-2)]

(1-4) Preparation of Optically Anisotropic Layer C (A-Plate)

The alignment film prepared in (1-3) was continuously subjected to a rubbing treatment. At this time, the longitudinal direction of the long film was parallel to the transport direction and an angle formed between the longitudinal direction of the film and the rotation axis of the rubbing roller was 75° (clockwise) (when the longitudinal direction of the film was 90°, the angle of the rotation axis of the rubbing roller was 15°).

An optically anisotropic layer coating liquid (C) including rod-like liquid crystal compounds and having the following composition was continuously applied to the prepared alignment film using a #2.2 wire bar. The transport velocity (V) of the film was 26 m/min. In order to dry the solvent of the coating liquid and to align and age the rod-like liquid crystal compounds, the coating liquid was heated for 60 seconds by hot air at a temperature of 60° C. and subjected to UV irradiation at 60° C. to fix the alignment of the rod-like liquid crystal compounds. Thus, an optically anisotropic layer C was prepared. The thickness of the optically anisotropic layer C was 0.8 μm. It was confirmed that the average tilt angle of the major axis of the rod-like liquid crystal compound to the plane of the film was 0° and the liquid crystal compound was aligned horizontally to the plane of the film. In addition, the angle of the slow axis was orthogonal to the rotation axis of the rubbing roller and was 105° when the longitudinal direction of the film was 90° (the width direction of the film was 0°).

| Composition of Optically Anisotropic Layer Coating Liquid (C) | |
|---|---|
| Rod-like liquid crystal compound-1 | 80 parts by mass |
| Rod-like liquid crystal compound-2 | 20 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |
| Fluorine-containing compound (FP-2) | 0.3 parts by mass |
| Methyl ethyl ketone | 193 parts by mass |

(1-5) Preparation of Polarizer

A polyvinyl alcohol (PVA) film having a thickness of 80 μm was dyed by immersing the film in an aqueous iodine solution having an iodine concentration of 0.05% by mass for 60 seconds at 30° C. Then, the film was longitudinally stretched 5 times the original length while being immersed in an aqueous boric acid solution having a boric acid concentration of 4% by mass for 60 seconds, and then dried at 50° C. for 4 minutes. Thus, a polarizer having a thickness of 20 μm was obtained.

(1-6) Saponification of Polarizer Protective Film

A commercially available cellulose acylate-based film "TD80UL" (manufactured by Fuji Film Corporation) was prepared and immersed in an aqueous sodium hydroxide solution (1.5 mol/liter) at 55° C. Thereafter, the film was fully washed with water to remove sodium hydroxide. After the film was immersed in an aqueous diluted sulfuric acid solution (0.005 mol/liter) at 35° C. for 1 minute, the film was immersed in water and fully washed therein to remove the aqueous diluted sulfuric acid solution. Finally, the sample was fully dried at 120° C. to prepare a polarizer protective film.

(1-7) Preparation of Circularly Polarizing Plate

The polarizer protective film prepared in (1-6) was attached to the one surface of the polarizer prepared in (1-5) with a polyvinyl alcohol-based adhesive. Next, the cellulose acylate film side of the λ/2 plate prepared in (1-2) was attached to the other surface of the polarizer with a pressure sensitive adhesive. Subsequently, the side of the optically anisotropic layer B prepared in (1-3) in which the rod-like liquid crystal compounds were applied was attached to the λ/2 plate side with a pressure sensitive adhesive and the peelable support was removed from the optically anisotropic layer B. Next, the side of the laminate in which the optically anisotropic layer C prepared in (1-4) was provided was attached to the optically anisotropic layer B with a pressure sensitive adhesive and the peelable support was removed from the optically anisotropic layer C. Thus, a circularly polarizing plate was prepared. In the prepared circularly polarizing plate, the lamination order of A-plate and C-plate was as in the configuration in FIG. 1.

The axial relationship of each layer in the circularly polarizing plates of Example 1 and Examples 2 to 6 and Comparative Examples 1 to 6, which will be described later, will be described in detail later.

Example 2

(2-1) Preparation of Optically Anisotropic Layer C-2 (A-Plate)

An optically anisotropic layer C-2 was prepared according to the same procedure as in (1-4) of Example 1 except that the wire bar coater for applying the optically anisotropic layer coating liquid (C) was changed to #4.4.

(2-2) Preparation of Optically Anisotropic Layer B (C-Plate)

An optically anisotropic layer B was prepared according to the same procedure as in (1-3) of Example 1.

(2-3) Preparation of λ/4 Plate

A λ/4 plate was prepared according to the same procedure as in (1-2) of Example 1 except that the wire bar coater for applying the optically anisotropic layer coating liquid (A) was changed to #2.5.

(2-4) Preparation of Circularly Polarizing Plate

The polarizer protective film prepared in (1-6) of Example 1 was attached to the one surface of the polarizer prepared in (1-5) of Example 1 with a polyvinyl alcohol-based adhesive. The side of the optically anisotropic layer B prepared in (2-2) in which the rod-like liquid crystal compounds were applied was attached to the other surface of the polarizer using a pressure sensitive adhesive and the peelable support was removed from the optically anisotropic layer B. Next, the side of the laminate in which the optically anisotropic layer C-2 prepared in (2-1) was provided was attached to the optically anisotropic layer B using a pressure sensitive adhesive and the peelable support was removed from the optically anisotropic layer C-2. Next, the cellulose acylate film side of the λ/4 plate prepared in (2-3) in which was attached to the optically anisotropic layer C-2 using a pressure sensitive adhesive and thus a circularly polarizing plate was prepared. In the prepared circularly polarizing plate, the lamination order of A-plate and C-plate was as in the configuration in FIG. 1.

Example 3

(3-1) Preparation of Optically Anisotropic Layer B-3 (C-Plate)

An optically anisotropic layer B-3 was prepared according to the same procedure as in (1-3) of Example 1 except that the wire bar coater for applying the optically anisotropic layer coating liquid (B) was changed to #6.3.

(3-2) Preparation of A-Plate

A commercially available norbornene-based polymer film "ZEONOR ZF14" (manufactured by Zeon Corporation) was stretched obliquely and adjusted to have a film thickness of 30 μm to obtain a polymer film having Re(550) of 125 nm and Rth(550) of 70 nm.

(3-3) Preparation of Circularly Polarizing Plate

A circularly polarizing plate was prepared according to the same procedure as in (1-7) of Example 1 except that the optically anisotropic layer B-3 prepared in (3-1) was used instead of using the optically anisotropic layer B and the A-plate prepared in (3-2) was used instead of using the optically anisotropic layer C.

Example 4

(4-1) Preparation of Optically Anisotropic Layer B-4

An optically anisotropic layer B-4 was prepared according to the same procedure as in (1-3) of Example 1 except that the wire bar coater for applying optically anisotropic layer coating liquid (B) was changed to #3.8.

(4-2) Preparation of A-Plate

An A-plate (corresponding to a λ/4 film), which is a polycarbonate-based film and used for 3D glasses as an accompanying item of 55LW5700 of a 3D-TV manufactured by LG Electronics, was peeled off.

(4-3) Preparation of Circularly Polarizing Plate

A circularly polarizing plate was prepared according to the same procedure as in (1-7) of Example 1 except that the optically anisotropic layer B-4 prepared in (4-1) was used instead of using the optically anisotropic layer B and the A-plate prepared in (4-2) was used instead of using the optically anisotropic layer C.

Example 5

(5-1) Preparation of A-Plate (Polymer Film)

A commercially available norbornene-based polymer film "ZEONOR ZF14" (manufactured by Zeon Corporation) was stretched obliquely and adjusted to have a film thickness of 15 μm to obtain a polymer film having Re(550) of 125 nm and Rth(550) of 62.5 nm. Then, two sheets of the polymer films were attached to each other with a pressure sensitive adhesive such that the slow axes were parallel to each other. Thus, an A-plate (polymer film) having Re(550) of 250 nm and Rth(550) of 125 nm in total was obtained.

(5-2) Preparation of Circularly Polarizing Plate

A circularly polarizing plate was prepared according to the same procedure as in (2-4) of Example 2 except that the A-plate (polymer film) prepared in (5-1) was used instead of using the optically anisotropic layer C-2 (A-plate).

Example 6

(6-1) Preparation of A-Plate (Polymer Film)

A λ/4 film, which is a polycarbonate-based film and used for 3D glasses as an accompanying item of 55LW5700 of a 3D-TV manufactured by LG Electronics, was peeled off to obtain a polymer film having Re(550) of 125 nm and Rth(550) of 62.5 nm. Then, two sheets of the polymer films were attached to each other with a pressure sensitive adhesive such that the slow axes were parallel to each other. Thus, a polymer film having Re(550) of 250 nm and Rth(550) of 125 nm in total was obtained.

(6-2) Preparation of Circularly Polarizing Plate

A circularly polarizing plate was prepared according to the same procedure as in (2-4) of Example 2 except that the A-plate (polymer film) prepared in (6-1) was used instead of using the optically anisotropic layer C-2 (A-plate).

COMPARATIVE EXAMPLES (10-1) Preparation of Transparent Support

Transparent supports (TACKs) having predetermined optical properties, formed of cellulose acylate, and used as C-plates were prepared in Comparative Examples 1 to 6 shown in Table 1 below using various known technologies.

(10-2) Application of Liquid Crystal Compound to Transparent Support

An alignment film was formed on each transparent support as in (1-2) of Example 1.

(Formation of Optically Anisotropic Layer Including Discotic Liquid Crystal (DLC) Compound)

Optically anisotropic layers were prepared according to the same procedure as in (1-2) of Example 1 except that the wire bar coater was changed to #2.5 to 5.0. Re(550) of the obtained optically anisotropic layer was 125 to 250 nm.

(Formation of Optically Anisotropic Layer Including Rod-Like Liquid Crystal (RLC) Compound)

Optically anisotropic layers were prepared according to the same procedure as in (1-4) of Example 1 except that the wire bar coater was changed to #2.2 to 4.0. Re(550) of the obtained optically anisotropic layer was 125 to 250 nm.

Comparative Examples 1 to 4

A discotic liquid crystal compound or a rod-like liquid crystal compound was respectively applied to the predetermined transparent support (C-plate) prepared in the aforementioned (10-1) in the method described in the aforementioned (10-2). Two sheets of the films thus obtained were attached to the polarizer prepared in (1-5) of Example 1 with a pressure sensitive adhesive. Finally, the polarizer protective film prepared in (1-6) of Example 1 was attached to the surface of the polarizer using a polyvinyl-based pressure sensitive adhesive and thus various circularly polarizing plates shown in Comparative Examples 1 to 4 in Table 1 were prepared.

Comparative Example 5

The ZEONOR films obtained in (5-1) of Example 5 and (3-2) of Example 3 were respectively attached to the transparent support (C-plate) prepared in the aforementioned (10-1) with a pressure sensitive adhesive. Two sheets of the films thus obtained were attached to the polarizer prepared in (1-5) of Example 1 with a pressure sensitive adhesive. Finally, the polarizer protective film prepared in (1-6) of Example 1 was attached to the surface of the polarizer using a polyvinyl-based pressure sensitive adhesive and thus a circularly polarizing plate shown in Comparative Example 5 in Table 1 was prepared.

Comparative Example 6

The polycarbonate-based films obtained in (6-1) of Example 6 and (4-2) of Example 4 were attached to the transparent support (C-plate) prepared in the aforementioned (10-1) with a pressure sensitive adhesive. Two sheets of the films thus obtained were attached to the polarizer prepared in (1-5) of Example 1 with a pressure sensitive adhesive. Finally, the polarizer protective film prepared in (1-6) of Example 1 was attached to the surface of the polarizer using a polyvinyl-based pressure sensitive adhesive and thus a circularly polarizing plate shown in Comparative Example 6 in Table 1 were prepared.

In the circularly polarizing plates prepared in Comparative Examples 1 to 6, the lamination order of A-plate and C-plate was as in the configuration in FIG. 1.

(Mounting on Display Device)

GALAXY S5 having an organic EL panel mounted thereon, manufactured by Samsung Electronics Co., Ltd., was disassembled and the circularly polarizing plate was peeled off. The circularly polarizing plate in each of Examples and Comparative Examples shown in Table 1 was attached to prepare a display device (organic EL display device).

(Evaluation of Display Performance)

Regarding the prepared organic EL display devices, visibility and display quality under bright light were evaluated. The reflected light when a fluorescent lamp was illuminated on the display device from a polar angle of 45 degrees while black display was performed on the display device was observed. The display quality at a polar angle of 45 degrees was evaluated based on the following criteria. The evaluation results are collectively shown in Table 1.

4: No color tint in black color is visibly recognized (allowable).

3: Slight coloring can be visibly recognized.

2: Clear coloring can be visibly recognized.

1: Coloring is visibly recognized and the reflectivity is high.

In Table 1, the column "Re(nm)" denotes the value of Re(550) and the column "Rth(nm)" denotes the value of Rth(550).

In addition, the column "Nz1" denotes the value of the Nz factor of the λ/2 plate and the column "Nz2" denotes the value of the Nz factor of the λ/4 plate.

In Table 1, regarding the column "Relationship of Expression", the case in which either of the relationships of Expressions (1) and (2) or the relationships of Expressions (3) and (4) is satisfied is set to "A" and the case in which none of these relationships is satisfied is set to "B".

In all of Examples 1, 3 and 4, and Comparative Examples 1 and 2, the lamination order of A-plate and C-plate was the same as in the configuration in FIG. 1, an angle formed between the absorption axis of the polarizer and the slow axis of the A-plate in the λ/2 plate was 75°, and an angle formed between the absorption axis of the polarizer and the slow axis of the A-plate in the λ/4 plate was 15°. In addition, in all of Examples 2, 5 and 6 and Comparative Examples 3 to 6, the lamination order of A-plate and C-plate was the same as in the configuration in FIG. 1, an angle formed between the absorption axis of the polarizer and the slow axis of the A-plate in the λ/2 plate was 15°, and an angle formed between the absorption axis of the polarizer and the slow axis of the A-plate in the λ/4 plate was 75°.

In Table 1, the term "TACK" denotes a cellulose acylate film, the term "DLC" denotes a discotic liquid crystal compound, the term "RLC" denotes a rod-like liquid crystal compound. In addition, the terms "vertical alignment" and "horizontal alignment" denote the alignment states of the respective liquid crystal compounds.

TABLE 1

| | Composition | | | | Re(nm) | | | | Rth (nm) | |
|---|---|---|---|---|---|---|---|---|---|---|
| | λ/2 plate | | λ/4 plate | | λ/2 plate | | λ/4 plate | | λ/2 plate | |
| | C-plate | A-plate | C-plate | A-plate | C-plate | A-plate | C-plate | A-plate | C-plate | A-plate |
| Example 1 | TACK | DLC | CLC (vertical alignment) | CLC (horizontal alignment) | 1.0 | 250 | 0.1 | 125 | 40 | −125 |
| Example 2 | CLC (vertical alignment) | CLC (horizontal alignment) | TACK | DLC | 0.1 | 250 | 1.0 | 125 | −40 | 125 |
| Example 3 | TACK | DLC | CLC (vertical alignment) | Zeonor | 1.0 | 250 | 0.1 | 125 | 40 | −125 |
| Example 4 | TACK | DLC | CLC (vertical alignment) | PC | 1.0 | 250 | 0.1 | 125 | 40 | −125 |
| Example 5 | CLC (vertical alignment) | Zeonor | TACK | DLC | 0.1 | 250 | 1.0 | 125 | −40 | 125 |

TABLE 1-continued

| | | | | | | | | | | | |
|---|---|---|---|---|---|---|---|---|---|---|---|
| Example 6 | CLC (vertical alignment) | PC | TACK | DLC | 0.1 | 250 | 1.0 | 125 | −40 | 125 |
| Comparative Example 1 | TACK | DLC | TACK | CLC (horizontal alignment) | 1.0 | 250 | 1.0 | 125 | 40 | −125 |
| Comparative Example 2 | TACK | DLC | TACK | DLC | 1.0 | 250 | 1.0 | 125 | 70 | −125 |
| Comparative Example 3 | TACK | CLC (horizontal alignment) | TACK | CLC (horizontal alignment) | 1.0 | 250 | 1.0 | 125 | −80 | 125 |
| Comparative Example 4 | TACK | CLC (horizontal alignment) | TACK | DLC | 1.0 | 250 | 1.0 | 125 | −40 | 125 |
| Comparative Example 5 | TACK | Zeonor | TACK | Zeonor | 1.0 | 250 | 1.0 | 125 | −80 | 125 |
| Comparative Example 6 | TACK | PC | TACK | PC | 1.0 | 250 | 1.0 | 125 | −80 | 125 |

| | Rth (nm) | | Nz factor | | Film thickness (μm) | | | | | | |
|---|---|---|---|---|---|---|---|---|---|---|---|
| | λ/4 plate | | | | λ/2 plate | | λ/4 plate | | Total film thickness | Relationship of Expression | Evaluation |
| | C-plate | A-plate | Nz1 | Nz2 | C-plate | A-plate | C-plate | A-plate | | | |
| Example 1 | −40 | 63 | 0.15 | 0.69 | 40 | 2 | 3 | 1 | 46 | A | 4 |
| Example 2 | 40 | −63 | 0.85 | 0.31 | 3 | 2 | 40 | 1 | 46 | A | 4 |
| Example 3 | −50 | 70 | 0.15 | 0.67 | 40 | 2 | 4 | 30 | 76 | A | 4 |
| Example 4 | −30 | 50 | 0.15 | 0.67 | 40 | 2 | 2 | 40 | 84 | A | 4 |
| Example 5 | 40 | −63 | 0.85 | 0.31 | 3 | 30 | 40 | 1 | 74 | A | 4 |
| Example 6 | 40 | −63 | 0.85 | 0.31 | 3 | 40 | 40 | 1 | 84 | A | 4 |
| Comparative Example 1 | −30 | 63 | 0.15 | 0.78 | 40 | 2 | 30 | 1 | 73 | A | 2 |
| Comparative Example 2 | 100 | −63 | 0.27 | 0.81 | 70 | 2 | 70 | 1 | 143 | A | 2 |
| Comparative Example 3 | −120 | 63 | 0.69 | 0.03 | 80 | 2 | 120 | 1 | 203 | A | 2 |
| Comparative Example 4 | 40 | −63 | 0.85 | 0.31 | 40 | 2 | 40 | 3 | 85 | A | 3 |
| Comparative Example 5 | −120 | 69 | 0.69 | 0.08 | 80 | 30 | 120 | 30 | 260 | A | 2 |
| Comparative Example 6 | −120 | 52 | 0.90 | −0.07 | 80 | 40 | 120 | 40 | 280 | B | 2 |

As shown in Table 1 above, it was confirmed that the circularly polarizing plate of the present invention was used, desired effects could be obtained.

On the other hand, it was confirmed that in Comparative Examples 1 to 6 in which the optically anisotropic layer including a liquid crystal compound having a predetermined Rth was not used, desired effects could not be obtained.

Particularly, Comparative Example 2 corresponds to Example 61 described in Examples of WO2013/137464A and Comparative Example 3 corresponds to Example 75 described in Examples of WO2013/137464A, respectively. It was confirmed that with the embodiments of WO2013/137464A, desired effects could not be obtained.

Explanation of References 10, 110, 210, 310: circularly polarizing plate
12: polarizer
14: λ/2 plate
16: λ/4 plate
18: first C-plate
20: first A-plate
22: second C-plate
24: second A-plate
26: organic EL display device
28: organic EL panel

What is claimed is:

1. A circularly polarizing plate comprising, in this order:
a polarizer;
a λ/2 plate; and
a λ/4 plate,
wherein the λ/2 plate is a laminate of a first A-plate and a first C-plate,
the λ/4 plate is a laminate of a second A-plate and a second C-plate,
one of the first C-plate and the second C-plate is a cellulose acylate film having a retardation Rth in a thickness direction at a wavelength of 550 nm of 30 to 50 nm,
the other of the first C-plate and the second C-plate is an optically anisotropic layer including a liquid crystal compound having a retardation Rth in a thickness direction at a wavelength of 550 nm of −60 to −30 nm,
in a case in which the first A-plate is a negative A-plate, Expressions (1) and (2) below are satisfied, and
in a case in which the first A-plate is a positive A-plate, Expressions (3) and (4) below are satisfied, $$0 < Nz \text{ factor of the } \lambda/2 \text{ plate} \leq 0.35 \quad \text{Expression (1)}$$

$$0.65 \leq Nz \text{ factor of the } \lambda/4 \text{ plate} < 1 \quad \text{Expression (2)}$$

$$0.65 < Nz \text{ factor of the } \lambda/2 \text{ plate} < 1.0 \quad \text{Expression (3)}$$

$$0 < Nz \text{ factor of } \lambda/4 \text{ plate} \leq 0.35 \quad \text{Expression (4)}.$$

2. The circularly polarizing plate according to claim 1, wherein the first A-plate and the second A-plate each include a liquid crystal compound.

3. The circularly polarizing plate according to claim 1, wherein the liquid crystal compound in the optically anisotropic layer is a rod-like liquid crystal compound.

4. The circularly polarizing plate according to claim 2, wherein the liquid crystal compound in the optically anisotropic layer is a rod-like liquid crystal compound.

5. The circularly polarizing plate according to claim 1, wherein the circularly polarizing plate has a thickness of 60 μm or less.

6. The circularly polarizing plate according to claim 2, wherein the circularly polarizing plate has a thickness of 60 μm or less.

7. The circularly polarizing plate according to claim 3, wherein the circularly polarizing plate has a thickness of 60 μm or less.

8. The circularly polarizing plate according to claim 4, wherein the circularly polarizing plate has a thickness of 60 μm or less.

9. A display device comprising:
the circularly polarizing plate according to claim 1.

10. A display device comprising:
the circularly polarizing plate according to claim 2.

11. A display device comprising:
the circularly polarizing plate according to claim 3.

12. A display device comprising:
the circularly polarizing plate according to claim 4.

13. A display device comprising:
the circularly polarizing plate according to claim 5.

14. A display device comprising:
the circularly polarizing plate according to claim 6.

15. A display device comprising:
the circularly polarizing plate according to claim 7.

16. A display device comprising:
the circularly polarizing plate according to claim 8.

* * * * *